United States Patent
Li et al.

(10) Patent No.: US 12,428,513 B1
(45) Date of Patent: Sep. 30, 2025

(54) CYCLIC OLEFIN COPOLYMER, CURABLE COMPOSITION, COMPOSITE PRODUCT AND LAMINATE

(71) Applicant: CPC CORPORATION, TAIWAN, Kaohsiung (TW)

(72) Inventors: Sheng-De Li, Zhubei (TW); Lin-Chiang Huang, Chia-Yi (TW); Jui-Fu Kao, Chia-Yi (TW); Ming-Yu Huang, Chia-Yi (TW); Jann-Chen Lin, Chia-Yi (TW)

(73) Assignee: CPC CORPORATION, TAIWAN, Kaohsiung (TW)

( * ) Notice: Subject to any disclaimer, the term of this patent is extended or adjusted under 35 U.S.C. 154(b) by 0 days.

(21) Appl. No.: 19/056,773

(22) Filed: Feb. 19, 2025

(30) Foreign Application Priority Data

Mar. 28, 2024 (TW) .................................. 113111808

(51) Int. Cl.
| C08F 232/08 | (2006.01) |
| C08F 220/40 | (2006.01) |
| C08J 5/24 | (2006.01) |
| C08L 71/12 | (2006.01) |
| H05K 1/03 | (2006.01) |

(52) U.S. Cl.
CPC .......... C08F 232/08 (2013.01); C08F 220/40 (2013.01); C08J 5/244 (2021.05); C08L 71/12 (2013.01); C08F 2800/10 (2013.01); C08J 2371/12 (2013.01); C08J 2433/10 (2013.01); C08J 2445/00 (2013.01); C08J 2453/02 (2013.01); H05K 1/0366 (2013.01)

(58) Field of Classification Search
CPC .................................................... C08F 323/08
See application file for complete search history.

Primary Examiner — Ian A Rummel

(57) ABSTRACT

A cyclic olefin copolymer comprises a structural unit represented by Formula (I) and a structural unit represented by Formula (II)

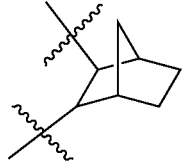

Formula (I)

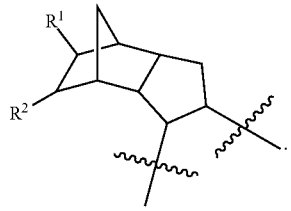

Formula (II)

In the structural unit represented by Formula (II), $R^1$ and $R^2$ independently represent hydrogen, acryloyloxy $[CH_2=CH-C(O)-O-]$ or (methacryloyloxy)ethyleneoxy $[CHCH_3=CH-C(O)-O-C_2H_5-O-]$, with the proviso that $R^1$ and $R^2$ are not both hydrogen. The present invention also provides a curable composition comprising the cyclic olefin copolymer described above, a composite product comprising a substrate and a cured product formed from the curable composition, and a laminate comprising the cured product or the composite product.

20 Claims, No Drawings

CYCLIC OLEFIN COPOLYMER, CURABLE COMPOSITION, COMPOSITE PRODUCT AND LAMINATE

CROSS-REFERENCE TO RELATED APPLICATION

This non-provisional application claims priority under 35 U.S.C. § 119(a) on Patent Application No(s). 113111808 filed in Taiwan, R.O.C. on Mar. 28, 2024, the entire contents of which are hereby incorporated by reference.

BACKGROUND OF THE INVENTION

1. Field of the Invention

The present disclosure relates to a copolymer and a curable composition, in particular to a cyclic olefin copolymer, a curable composition including the cyclic olefin copolymer, a composite product, and a laminate including the composite product or a cured product formed from the curable composition.

2. Description of the Related Art

As the design of electronic products tends to be thin, light and compact, and the electronic products need to transmit information quickly and in large quantities, the conductive lines of the electronic products are becoming denser to achieve characteristics of higher transmission speeds and lower delay time. In order to meet the above requirements, the carrier board in electronic products such as printed circuit boards or integrated circuit boards must have both a low dielectric constant (abbreviated as Dk) and a low dissipation factor (abbreviated as Df), at the same time, the raw materials used to prepare the carrier board need to be configured into a coating liquid that can be coated or an impregnating liquid that can be impregnated, so that the required carrier board can be prepared and thus have processability.

Generally speaking, the carrier board is a copper foil substrate including a copper foil and an insulating layer mounted on the copper foil, and the insulating layer is an insulating layer composed of cyclic olefin resin and glass fiber cloth. The cyclic olefin resin is formed by polymerization of several cyclic olefin monomers, such as norbornene and dicyclopentadiene. Although the cyclic olefin resin can be applied to copper foil substrates, the molecular weight of the cyclic olefin resin is not easy to control, resulting in many restrictions on the configuration of coating liquid or impregnating liquid, so the processability of the cyclic olefin resin is poor. In addition, the adhesion between the insulating layer and the copper foil is poor, which makes it easy for the insulating layer to separate from the copper foil, resulting in poor yield of the copper foil substrate.

BRIEF SUMMARY OF THE INVENTION

Therefore, a first object of the present disclosure is to provide a cyclic olefin copolymer.

Accordingly, the cyclic olefin copolymer of the present disclosure includes a structural unit represented by Formula (I) and a structural unit represented by Formula (II),

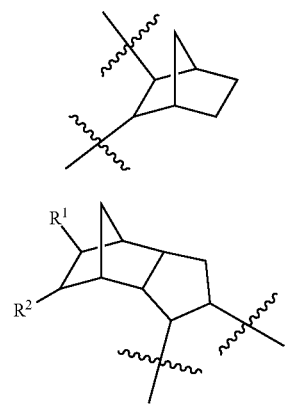

Formula (I)

Formula (II)

In the structural unit represented by Formula (II), $R^1$ and $R^2$ independently represent hydrogen, acryloyloxy [$CH_2$=CH—C(O)—O—] or (methacryloyloxy)ethyleneoxy [$CHCH_3$=CH—C(O)—O—$C_2H_5$—O—], with the proviso that $R^1$ and $R^2$ are not both hydrogen, and the number average molecular weight of the cyclic olefin copolymer is 500 g/mol to 11,000 g/mol.

A second object of the present disclosure is to provide a curable composition.

Accordingly, the curable composition of the present disclosure includes the cyclic olefin copolymer described above and resin, wherein based on the total amount of the curable composition being 100 wt %, the content of the cyclic olefin copolymer is 10 wt % to 50 wt %.

A third object of the present disclosure is to provide a composite product.

Accordingly, the composite product includes a substrate and a cured product formed from the curable composition described above. The cured product is distributed on the substrate.

A fourth object of the present disclosure is to provide a laminate.

Accordingly, the laminate includes a conductive component and an insulating layer disposed on a surface of the conductive component, and the insulating layer includes the composite product or the insulating layer includes a cured product formed from the curable composition.

The effect of the present disclosure is that: through the design of the structural unit represented by Formula (II), the cyclic olefin copolymer of the present disclosure has excellent toluene solubility, which is conducive to being distributed in the substrate or forming the insulating layer, thereby improving the processability of the cyclic olefin copolymer, at the same time, the cyclic olefin copolymer of the present disclosure and the conductive component therebetween have excellent adhesion (fitting), so that the insulating layer will not be separated from the conductive component, so as to obtain a laminate with excellent yield.

BRIEF DESCRIPTION OF THE DRAWINGS

None

DETAILED DESCRIPTION OF THE INVENTION

The contents of the present disclosure will be described in detail below.

<Cyclic Olefin Copolymers>

The cyclic olefin copolymer of the present disclosure includes a structural unit represented by Formula (I) and a structural unit represented by Formula (II),

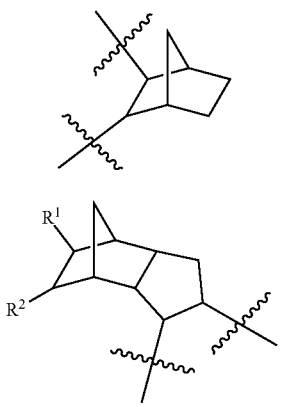

Formula (I)

Formula (II)

In the structural unit represented by Formula (II), $R^1$ and $R^2$ independently represent hydrogen, acryloyloxy [$CH_2=CH-C(O)-O-$] or (methacryloyloxy)ethyleneoxy [$CHCH_3=CH-C(O)-O-C_2H_5-O-$], with the proviso that $R^1$ and $R^2$ are not both hydrogen. The number average molecular weight of the cyclic olefin copolymer is 500 g/mol to 11,000 g/mol.

In some embodiments of the present disclosure, the cyclic olefin copolymer is formed by polymerization of a monomer reaction component including norbornene and a dicyclopentadiene-based compound represented by Formula (i),

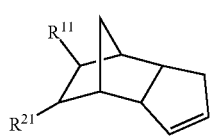

Formula (i)

In the dicyclopentadiene-based compound represented by Formula (i), $R^{11}$ and $R^{21}$ are as the above $R^1$ and $R^2$, respectively.

In some embodiments of the present disclosure, the dicyclopentadiene-based compound represented by Formula (i) is such as, but not limited to, dihydrodicyclopentadienyl acrylate, dihydrodicyclopentadienyl methacrylate, dicyclopentadienyloxyethyl acrylate or dicyclopentadienyloxyethyl methacrylate.

In some embodiments of the present disclosure, a molar ratio of the norbornene to the dicyclopentadiene-based compound represented by the Formula (i) is 1:9 to 9:1, such as 1:1, 3:1, 4:1, 5:1 or 6:1. The higher the amount of the dicyclopentadiene-based compound represented by Formula (i) is, the more structural units represented by Formula (II) of the cyclic olefin copolymer are, resulting in improved reactivity of the curable composition including the cyclic olefin copolymer.

In some embodiments of the present disclosure, the cyclic olefin copolymer further includes a α-olefin-based structural unit.

The α-olefin-based structural unit is such as, but not limited to, a structural unit represented by Formula (III),

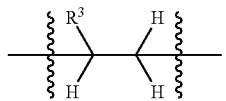

Formula (III)

$R^3$ is $C_{1-10}$ alkyl group, $C_{1-10}$ fluoroalkyl group, $C_{3-10}$ alkenyl group, $C_{6-12}$ aryl group, $C_{6-12}$ arylalkyl group, $C_{5-12}$ cycloalkyl group, $C_{6-12}$ cycloalkylalkyl group, $C_{2-6}$ alkanoyl group, $C_{2-6}$ alkanoyloxy group or $C_{2-6}$ alkoxycarbonyl group.

The $C_{1-10}$ alkyl group is a linear alkyl group or a branched alkyl group. The $C_{1-10}$ alkyl group is such as methyl, ethyl, propyl, butyl, pentyl, hexyl or isomers of the above.

The $C_{1-10}$ fluoroalkyl group is a linear alkyl group in which all or part of the hydrogen on the carbon is substituted by fluorine or a branched alkyl group in which all or part of the hydrogen on the carbon is substituted by fluorine. The $C_{1-10}$ fluoroalkyl group is such as fluoromethyl, fluoroethyl, fluoropropyl, fluorobutyl, fluoropentyl, fluorohexyl or isomers of the above. The fluoromethyl group is, for example, $-CH_2F$, $-CHF_2$ or $-CF_3$.

The $C_{3-10}$ alkenyl group is a linear alkenyl group or a branched alkenyl group. The $C_{3-10}$ alkenyl group is such as vinyl, propenyl, butenyl, pentenyl, hexenyl, heptenyl, octenyl or isomers of the above.

The $C_{6-12}$ aryl group is such as phenyl, biphenyl or naphthyl.

The $C_{6-12}$ arylalkyl group is such as benzyl or phenylethyl.

The $C_{5-12}$ cycloalkyl group is such as cyclopentyl, cyclohexyl or cycloheptyl.

The $C_{6-12}$ cycloalkylalkyl group is such as cyclohexylmethyl or cyclohexylethyl.

The $C_{2-6}$ alkanoyl group is a linear alkyl acyl group or a branched alkyl acyl group. The $C_{2-6}$ alkanoyl group is such as acetyl, propionyl or butyryl.

The $C_{2-6}$ alkanoyloxy group is a linear alkyl acyloxy group or a branched alkyl acyloxy group. The $C_{2-6}$ alkanoyloxy group is such as acetoxy, propionoxy or butyroxy.

The $C_{2-6}$ alkoxycarbonyl group is a linear alkoxy carbonyl group or a branched alkoxy carbonyl group. The $C_{2-6}$ alkoxycarbonyl group is such as methoxycarbonyl, ethoxycarbonyl or propoxycarbonyl.

In some embodiments of the present disclosure, the monomer reaction component further includes α-olefin. The α-olefin acts as a regulator for adjusting the molecular weight of the cyclic olefin copolymer.

In some embodiments of the present disclosure, taking the sum of the number of moles of the norbornene and the dicyclopentadiene-based compound represented by Formula (i) as 1 mol as a calculation basis, the usage amount of α-olefin-based compound is 0.01 eq to 0.5 eq, such as 0.01 eq, 0.03 eq, 0.05 eq, 0.07 eq, 0.09 eq, 0.1 eq, 0.3 eq, 0.4 eq or 0.5 eq.

The α-olefin-based compound is such as, but not limited to,

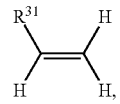

wherein $R^{31}$ is as described in $R^3$.

In some embodiments of the present disclosure, the α-olefin-based compound is selected from

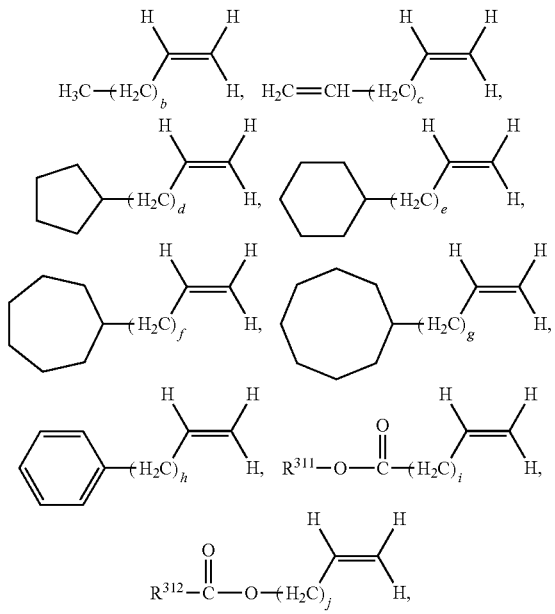

wherein b is 0, 1, 2, 3, 4, 5, 6, 7, 8 or 9; c is 0, 1, 2, 3, 4, 5, 6, 7 or 8; d is 0, 1, 2, 3, 4, 5, 6, or 7; e is 0, 1, 2, 3, 4, 5, or 6; f is 0, 1, 2, 3, 4, or 5; g is 0, 1, 2, 3 or 4; h is 0, 1, 2, 3, 4, 5, or 6; i is 0, 1, 2, 3 or 4, and $R^{311}$ is $C_{1-5}$ alkyl group; j is 0, 1, 2, 3, or 4, and $R^{312}$ is $C_{1-5}$ alkyl group.

In some embodiments of the present disclosure, the polymerization reaction is carried out under the condition that at least one metal catalyst is present. The metal catalyst can promote the ring-opening metathesis polymerization (abbreviated as ROMP) of the monomer reaction component and increase the copolymerization reaction rate of the monomer reaction component. In addition, the number average molecular weight of the cyclic olefin copolymer can be controlled by controlling the amount of metal catalyst. The metal catalyst is such as ruthenium carbene complex. The ruthenium carbene complex is such as, but not limited to, a first-generation Grubbs catalyst, a second-generation Grubbs catalyst or a hoveyda-Grubbs catalyst. The ruthenium carbene complex is such as, but not limited to, benzylidene[1,3-bis(2,4,6-trimethylphenyl)-2-imidazolidinylidene]dichloro(tricyclohexylphosphine)ruthenium. In some embodiments of the present disclosure, a molar ratio of the usage amount of the metal catalyst to the monomer reaction component is 1:5000 to 1:25000, such as 1:5000, 1:10000, 1:15000 or 1:20000.

In some embodiments of the present disclosure, the number average molecular weight of the cyclic olefin copolymer is 500 g/mol to 11000 g/mol, such as 500 g/mol, 600 g/mol, 700 g/mol, 800 g/mol, 900 g/mol, 1000 g/mol, 2000 g/mol, 3000 g/mol, 5000 g/mol, 10000 g/mol or 11000 g/mol. In some embodiments of the present disclosure, the number average molecular weight of the cyclic olefin copolymer is 1300 g/mol to 7500 g/mol. The number average molecular weight of the cyclic olefin copolymer is determined based on gel permeation chromatography, and polystyrene with a known number average molecular weight is used as a standard.

In some embodiments of the present disclosure, the polydispersity index (abbreviated as PDI) of the cyclic olefin copolymer is 1.0 to 5.0, such as 1.1, 1.3, 1.5, 1.7, 1.9, 2.1, 2.3, 2.5, 2.7, 2.9, 3.1, 3.3, 3.5, 3.7, 3.9, 4.1, 4.3, 4.5, 4.7 or 4.9. In some embodiments of the present disclosure, the polydispersity index (abbreviated as PDI) of the cyclic olefin copolymer is 1.0 to 2.5.

In some embodiments of the present disclosure, the cyclic olefin copolymer has a heat release amount of 40 J/g or more under the conditions of 40° C. to 280° C., such as 40 J/g to 60 J/g, 60 J/g to 80 J/g, 80 J/g to 100 J/g, 150 J/g to 200 J/g or 200 J/g to 250 J/g. In some embodiments of the present disclosure, the cyclic olefin copolymer has a heat release amount of 40 J/g to 230 J/g under conditions of 40° C. to 280° C. The greater the heat release amount of the cyclic olefin copolymer is, the better the reactivity of the cyclic olefin copolymer is, resulting in improved reactivity of the curable composition including the cyclic olefin copolymer.

<Curable Composition>

The curable composition of the present disclosure includes the above-mentioned cyclic olefin copolymer and resin.

The type of resin is selected based on the characteristics required for the application requirements of the curable composition. In some embodiments of the present disclosure, a weight ratio of the cyclic olefin copolymer to the resin is 10:90 to 90:10, such as 25:75, 50:50 or 75:25.

In some embodiments of the present disclosure, the number average molecular weight of the resin is 600 g/mol to 5000 g/mol, such as 650 g/mol, 800 g/mol, 1000 g/mol, 1200 g/mol, 1300 g/mol, 1400 g/mol, 1500 g/mol, 1600 g/mol, 1700 g/mol, 1800 g/mol, 1900 g/mol, 2000 g/mol, 2100 g/mol, 2300 g/mol, 2500 g/mol, 2700 g/mol, 2900 g/mol, 3000 g/mol, 3200 g/mol, 3400 g/mol, 3600 g/mol, 4000 g/mol or 5000 g/mol. In some embodiments of the present disclosure, the number average molecular weight of the resin is 2000 g/mol to 5000 g/mol. The number average molecular weight of the resin is determined based on gel permeation chromatography, polystyrene with a known number average molecular weight is used as a standard.

The resin may be used alone or in a mixture of multiple types, and the resin may be, for example, but not limited to, phenol resin, novolac resin, polystyrene resin, polyolefin resin, epoxy resin, polyimide resin, maleimide resin, bismaleimide resin, cyanate ester resin, styrene-butadiene copolymer resin, polyamide resin or polyphenylene ether resin.

The polyolefin resin is such as, but not limited to, polybutadiene resin, ring-opening polycyclic olefin resin (polyalkenamer resin), cyclic olefin polymer resin or cyclic olefin copolymer resin.

The epoxy resin is, for example, but not limited to bisphenol A epoxy resin, bisphenol F epoxy resin, bisphenol S epoxy resin, novolac epoxy resin, naphthalene-based epoxy resin, anthracene-based epoxy resin, bisphenol A diglycidyl ether epoxy resin), ethylene glycol diglycidyl ether epoxy resin, propylene glycol diglycidyl ether epoxy resin, or 1,4-butanediol diglycidyl ether epoxy resin.

The styrene butadiene copolymer resin is, for example, but not limited to polystyrene-butadiene-styrene resin.

In some embodiments of the present disclosure, the curable composition further includes a solvent. The solvent is used to dissolve any component of the curable composition or to promote homogeneous dispersion and mixing of the components.

The solvent may be used alone or in a mixture of multiple types, and the solvent is, for example, but not limited to aromatic hydrocarbon solvents, alcohol solvents, ether solvents, ketone solvents, ester solvents or nitrogen-containing solvents. In some embodiments of the present disclosure, the solvent is selected from benzene, toluene, xylene, ethylbenzene, diethylbenzene, trimethylbenzene, triethylbenzene, cyclohexane, cyclohexene, decalin, pentadiene, pentane, hexane, heptane, octane, nonane, decane, cyclohexane, methylcyclohexane, ethylcyclohexane, cyclohexene, p-menthane, dipropyl ether, dibutyl ether, anisole, butyl acetate, amyl acetate, methyl isobutyl ketone, cyclohexylbenzene, cyclohexanone, cyclopentanone, triethylene glycol dimethyl ether (triglyme), 1,3-dimethyl-2-imidazolidinone (abbreviated as DMI), N-methyl-2-pyrrolidone (abbreviated as NMP), methyl ethyl ketone (abbreviated as MEK), N,N-dimethylacetamide (abbreviated as DMAc), γ-butyrolactone (abbreviated as GBL), N,N-Dimethylformamide (abbreviated as DMF), propylene glycol methyl ether acetate (abbreviated as PGMEA) or dimethyl sulfoxide (abbreviated as DMSO).

In some embodiments of the present disclosure, the curable composition further includes an initiator. The initiator may be used alone or in a mixture of multiple types, and the initiator is, for example, but not limited to α,α'-bis(tert-butylperoxy)diisopropyl benzene. In some embodiments of the present disclosure, based on the total amount of the curable composition being 100 wt %, the content of the initiator is 0.1 wt % to 10 wt %, such as 0.2 wt %, 0.5 wt %, 0.8 wt %, 1.0 wt %, 1.5 wt %, 2.0 wt %, 2.5 wt %, 3.0 wt %, 4.0 wt %, 5.0 wt %, 6.0 wt %, 7.0 wt %, 8.0 wt % or 9.0 wt %.

In some embodiments of the present disclosure, the curable composition further includes a cross-linking agent. The cross-linking agent may be used alone or in mixture of multiple types, and the cross-linking agent is, for example, but not limited to, a methacrylate-based cross-linking agent, an acrylate-based cross-linking agent or a vinyl-based cross-linking agent. The methacrylate-based cross-linking agent is such as, but not limited to, ethylene glycol dimethacrylate, diethylene glycol dimethacrylate, triethylene glycol dimethacrylate, and tetraethylene glycol dimethacrylate, 1,3-butanediol dimethacrylate, 1,4-butanediol dimethacrylate, 1,6-hexanediol dimethacrylate, polyethylene glycol (200) dimethacrylate, polyethylene glycol (600) dimethacrylate or 1,12-dodecanediol dimethacrylate. The acrylate-based cross-linking agent is such as, but not limited to, pentaerythritol tetraacrylate, pentaerythritol hexaacrylate, di-1,6-hexanediol diacrylate, triethylene glycol diacrylate, tetraethylene glycol diacrylate, tripropylene glycol diacrylate, polybutadiene diacrylate, 3-methyl-1,5-pentanediol diacrylate, polyethylene glycol (200) diacrylate or polyethylene glycol (400) diacrylate. The vinyl-based cross-linking agent is such as, but not limited to, bis(vinylphenyl)ethane, bis(4-vinylphenyl)methane, 1,4-butadiene, divinylacetylene, divinylbenzene, divinyl ether, divinyl sulfide or 1,2,4-trivinylcyclohexane.

In some embodiments of the present disclosure, the curable composition further includes an additive. The additive may be used alone or in mixture of multiple types, and the additive is such as, but not limited to, a leveling agent, filler, colorant, defoaming agent or flame retardant.

In some embodiments of the present disclosure, the curable composition has a solid content of 10 wt % to 100 wt %, such as 15 wt %, 20 wt %, 25 wt %, 30 wt %, 35 wt %, 40 wt %, 45 wt %, 50 wt %, 55 wt %, 60 wt %, 70 wt %, 75 wt %, 80 wt %, 85 wt %, 90 wt % or 95 wt %.

Since the cyclic olefin copolymer of the present disclosure has the structural unit represented by formula (II), the cyclic olefin copolymer of the present disclosure has preferable reactivity, so that in the curable composition, the amount of the cyclic olefin copolymer is adjustable and the curable composition has a lower crosslinking temperature. Furthermore, during the preparation process of the cyclic olefin copolymer, since the components in the reaction components have moderate copolymerization reaction rates, the number average molecular weight of the cyclic olefin copolymer can be easily controlled, so that the cyclic olefin copolymer with good toluene solubility can be obtained. Furthermore, the curable composition can form a cured product with excellent dielectric properties (Dk is 3.3 or less and Df is 0.003 or less at a frequency of 10 GHz), and thus can be applied to electronic products such as printed circuit boards.

<Composite Product>

The composite product of the present disclosure includes a substrate and a cured product distributed in the substrate and formed by the above-mentioned curable composition.

The substrate is such as fiber cloth. The fiber cloth is such as glass fiber cloth.

The cured product is a fully cured cured product or a semi-cured cured product. The semi-cured cured product is, for example, but not limited to a B-stage cured product.

The composite product is, for example, but not limited to pre-preg or pre-impregnated.

<Laminate>

The laminate of the present disclosure includes a conductive component and an insulating layer disposed on the conductive component, and the insulating layer includes a cured product formed by the curable composition or the insulating layer includes the composite product described above.

The conductive component is, for example, copper foil.

The laminate is, for example, a copper foil substrate, a printed circuit board, or an integrated circuit carrier board. The printed circuit board is such as a high frequency printed circuit board.

The present disclosure will be further described with respect to the following embodiments, but it should be understood that the embodiments are for illustrative purposes only and should not be construed as limiting the implementation of the present disclosure.

Embodiment 1

Under nitrogen, benzylidene[1,3-bis(2,4,6-trimethylphenyl)-2-imidazolidinylidene]dichloro(tricyclohexylphosphine)ruthenium is dissolved in toluene to obtain a catalyst solution with a solid content of 5 wt %. Dihydrodicyclopentadienyl acrylate, norbornene and 1-hexene are mixed to obtain a monomer reaction component, wherein a molar ratio of norbornene to dihydrodicyclopentadienyl acrylate is 9:1. Next, the monomer reaction component is added to the catalyst solution and polymerized at 25° C. for 1440 minutes, wherein a molar ratio of the amount of benzylidene[1,3-bis(2,4,6-trimethylphenyl)-2-imidazolidinylidene]dichloro(tricyclohexylphosphine)ruthenium to the monomer reaction component is 1:20000, and taking the sum of the number of moles of dihydrodicyclopentadienyl acrylate and norbornene as 1 mol as a calculation basis, the usage amount of 1-hexene is 0.05 eq. Then, an appropriate amount of ethyl vinyl ether is added to stop the reaction. Next, the mixture is stirred overnight, then the catalyst is removed and the mixture is reprecipitated in methanol. After concentration and drying, a cyclic olefin copolymer is obtained.

Embodiments 2 to 7, Embodiment 9 and Comparative Examples 1 to 3

Embodiments 2 to 7, Embodiment 9 and Comparative examples 1 to 3 are carried out in the same steps as Embodiment 1, and the main difference lies in: changing the type and usage amount of each component, referring to Table 1 and Table 2.

Embodiment 8

Embodiment 8 is carried out in the same step as Embodiment 7, the main difference is that: dihydrodicyclopentadienyl acrylate is replaced by dicyclopentadienyloxyethyl methacrylate, and the polymerization reaction is carried out under the condition of 15° C.

Embodiments 10-12

Embodiments 10 to 12 are carried out in the same steps as Embodiment 7, the main difference is that: dihydrodicyclopentadienyl acrylate is replaced by dicyclopentadienyloxyethyl methacrylate, and the usage amount of dicyclopentadienyloxyethyl methacrylate is changed, and the polymerization reaction is carried out under the condition of 0° C. for 180 minutes, and then, the temperature is raised to room temperature, and the polymerization reaction is continuously carried out at room temperature, and the total time of the polymerization reaction is 1440 minutes.

Evaluation Items

Measurement of number average molecular weight and polydispersity index: gel permeation chromatography (brand: WATERS; model: Model 600) and refractive index detector (manufactured by RI Detector, and the model is Jasco PU2089) are used to measure the cyclic olefin copolymers of Embodiments 1 to 12 and Comparative examples 1 to 3, and polystyrene with a known number average molecular weight is used as a standard to prepare a calibration line.

Measurement of heat release amount: a differential scanning calorimeter (manufactured by TA Instruments, Inc., and the model is Q2000) is used to measure the cyclic olefin copolymers of Embodiments 1 to 12 and Comparative examples 1 to 3, and the measure is carried out at a heating rate of 20° C./min. The greater the heat release amount of the cyclic olefin copolymer at a temperature range of 40° C. to 280° C., the more reactive the cyclic olefin copolymer is.

Measurement of toluene solubility: at room temperature, the cyclic olefin copolymer of Embodiments 1 to 12 and Comparative examples 1 to 3 is added to toluene, wherein the weight ratio of the cyclic olefin copolymer to toluene is 1:1. Then, the solution is stirred for 10 minutes, then it stands for 1 hour, then filtered to obtain a filter cake, the filter cake is weighed, and then the concentration of the cyclic olefin copolymer dissolved in toluene is calculated according to the weight of the filter cake.

TABLE 1

| "—": unmeasured | | Embodiment | | | | | | | |
|---|---|---|---|---|---|---|---|---|---|
| | | 1 | 2 | 3 | 4 | 5 | 6 | 7 | 8 |
| benzylidene[1,3-bis(2,4,6-trimethylphenyl)-2-imidazolidinylidene]dichloro(tricyclohexylphosphine)ruthenium (g, ×10$^{-3}$) | | 6.24 | 6.24 | 6.2 | 6.24 | 6.24 | 6.24 | 6.24 | 12.5 |
| toluene (g) | | 22.76 | 22.76 | 22.76 | 22.76 | 22.76 | 22.76 | 22.76 | 45.85 |
| molar ratio of dihydrodicyclopentadienyl acrylate to norbornene | | 1:9 | 1:9 | 1:9 | 9:1 | 9:1 | 1:1 | 1:1 | — |
| molar ratio of dicyclopentadienyloxyethyl methacrylate to norbornene | | — | — | — | — | — | — | — | 1:9 |
| 1-hexene (eq) | | 0.05 | 0.1 | 0.3 | 0.05 | 0.3 | 0.05 | 0.3 | 0.3 |
| cyclic olefin copolymer | number average molecular weight (g/mol) | 5619 | 2942 | 1710 | 7039 | 1482 | 4117 | 1620 | 3468 |
| | polydispersity index | 2.03 | 1.83 | 1.59 | 1.81 | 1.40 | 2.39 | 1.69 | 1.85 |
| | heat release amount (J/g) | 70 | 63 | 49 | 255 | 91 | 77 | 79 | — |
| | yield (g) | 12.72 | 12.33 | 11.85 | 9.76 | 4.60 | 18.60 | 16.49 | 10.00 |
| | toluene solubility | | | | 50 wt % or more | | | | |

TABLE 2

|  |  | Embodiment | | | | Comparative example | | |
|---|---|---|---|---|---|---|---|---|
| "—": unmeasured | | 9 | 10 | 11 | 12 | 1 | 2 | 3 |
| benzylidene[1,3-bis(2,4,6-trimethylphenyl)-2-imidazolidinylidene]dichloro(tricyclohexylphosphine)ruthenium (g, ×10⁻³) | | 75.0 | 75.0 | 75.0 | 75.0 | 6.24 | 6.24 | 3.12 |
| toluene (g) | | 277.74 | 338.37 | 339.76 | 339.95 | 22.76 | 22.76 | 10.33 |
| molar ratio of dihydrodicyclopentadienyl acrylate to norbornene | | — | — | — | — | 1:9 | 1:9 | — |
| molar ratio of dicyclopentadienyloxyethyl methacrylate to norbornene | | 1:3 | 1:4 | 1:5 | 1:6 | — | — | 1:0 |
| 1-hexene (eq) | | 0.3 | 0.3 | 0.3 | 0.3 | 0.01 | 0.02 | 0.1 |
| cyclic olefin copolymer | number average molecular weight (g/mol) | 1606 | 1429 | 1487 | 1387 | 11768 | 11354 | 16029 |
| | polydispersity index | 1.54 | 1.42 | 1.45 | 1.42 | 1.82 | 1.82 | 2.34 |
| | heat release amount (J/g) | — | — | — | — | 62 | 76 | — |
| | yield (g) | 146.85 | 150.30 | 157.82 | 155.72 | 14.88 | 13.51 | 7.33 |
| | toluene solubility | | 50 wt % or more | | | undissolved | undissolved | undissolved |

As can be seen from Table 1 and Table 2, when the cyclic olefin copolymer is mainly structured with the structural unit represented by Formula (I) and the structural unit represented by Formula (II), the average molecular weight of the cyclic olefin copolymer can be controlled from 500 g/mol to 11000 g/mol, resulting in excellent toluene solubility of the cyclic olefin copolymer, thereby improving the processability of the cyclic olefin copolymer.

Application Example 1: Curable Compositions and Copper Foil Substrates 17 parts by weight of the cyclic olefin copolymer of Embodiment 7, 69 parts by weight of polyphenylene ether resin (manufactured and sold by Mitsubishi Gas Chemical; product number is OPE-2st; number average molecular weight is 2200 g/mol), 13 parts by weight of polystyrene-butadiene-styrene resin (manufactured by Cray Valley; product number is Ricon 100; number average molecular weight is 4500 g/mol) and 1 part by weight of α,α'-di(tertiary butylperoxy)diisopropyl benzene (product number: Perbutyl-P) are dissolved in toluene to obtain a curable composition.

Glass fiber cloth (commercial product purchased from Asahi Fiber Glass company and model number is L2116) is impregnated in the curable composition to obtain a rough green body, wherein in the rough green body, the impregnation amount of the curable composition is approximately 56 wt %. The rough green body is sent to a hot air circulation oven with a temperature set to 160° C. to carry out a cross-linking reaction until the curable composition is transformed into a semi-cured cured product to obtain a prepreg. Five prepregs are stacked to obtain a first laminate. Next, a copper foil is disposed on a surface of the first prepreg of the first laminate and a copper foil is disposed on a surface of the fifth prepreg of the first laminate to obtain a second laminate. Then, the second laminate is placed in a vacuum laminator. Next, the temperature is gradually raised to 210° C., and at the temperature, after 2 hours of hot pressing treatment, a copper foil substrate is obtained.

Application Examples 2-6

Application examples 2 to 6 are carried out in the same steps as Application example 1, the main difference lies in: changing the cyclic olefin polymer in the curable composition, referring to Table 3.

Evaluation Items

Measurement of dielectric constant (Dk) and dissipation factor (Df): Under the condition of frequency of 10 GHz, a microwave dielectrometer (purchased from AET company) is used to measure Dk and Df of the copper foil substrates of Application examples 1 to 6.

Measurement of peel strength (unit: lb/inch): according to the standard method IPC-TM-650-2.4.8 for testing peel strength of printed circuit boards, the copper foil substrates of Application examples 1 to 6 are tested.

TABLE 3

| curable composition | | Application example | | | | | |
|---|---|---|---|---|---|---|---|
| unit: part by weight | | 1 | 2 | 3 | 4 | 5 | 6 |
| cyclic olefin copolymer | Embodiment 7 | 17.4 | 0 | 0 | 0 | 0 | 0 |
| | Embodiment 8 | 0 | 17.4 | 0 | 0 | 0 | 0 |
| | Embodiment 9 | 0 | 0 | 17.4 | 0 | 0 | 0 |
| | Embodiment 10 | 0 | 0 | 0 | 17.4 | 0 | 0 |
| | Embodiment 11 | 0 | 0 | 0 | 0 | 17.4 | 0 |
| | Embodiment 12 | 0 | 0 | 0 | 0 | 0 | 17.4 |
| resin | polyphenylene ether resin | 69.4 | 69.4 | 69.4 | 69.4 | 69.4 | 69.4 |

TABLE 3-continued

| curable composition | | Application example | | | | | |
|---|---|---|---|---|---|---|---|
| unit: part by weight | | 1 | 2 | 3 | 4 | 5 | 6 |
| | polystyrene-butadiene-styrene resin | 13.2 | 13.2 | 13.2 | 13.2 | 13.2 | 13.2 |
| initiator | α,α'-bis(tert-butylperoxy)diisopropyl benzene | 1 | 1 | 1 | 1 | 1 | 1 |
| solvent | toluene | 57 | 57 | 57 | 56 | 54 | 54 |
| copper foil substrate | Dk | 3.17 | 3.14 | 3.16 | 3.18 | 3.23 | 3.13 |
| | Df | 0.0028 | 0.0029 | 0.0027 | 0.0026 | 0.0028 | 0.0025 |
| | peel strength (lb/inch) | 3.8 | 3.6 | 3.6 | 3.7 | 3.7 | 3.8 |

In summary, through the design of the structural unit represented by Formula (II), the cyclic olefin copolymer of the present disclosure has excellent toluene solubility and reactivity, which are conducive to being distributed in the substrate or forming the insulating layer, thereby improving the processability of the cyclic olefin copolymer, at the same time, the cyclic olefin copolymer of the present disclosure and the conductive component therebetween have excellent adhesion (fitting), so that the insulating layer will not be separated from the conductive component, so as to obtain a laminate with excellent yield, so the purpose of the present disclosure can indeed be achieved.

The above are only embodiments of the present invention. These embodiments cannot define the implementation scope of the present invention. Any simple equivalent changes and modifications made in accordance with the claims and the content of the specification of the present invention are still within the scope encompassed by the present invention.

While the present disclosure has been described by means of specific embodiments, numerous modifications and variations could be made thereto by those skilled in the art without departing from the scope and spirit of the present disclosure set forth in the claims.

What is claimed is:

1. A cyclic olefin copolymer, comprising:
a structural unit represented by Formula (I) and a structural unit represented by Formula (II),

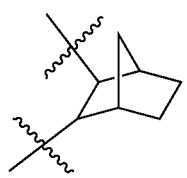

Formula (I)

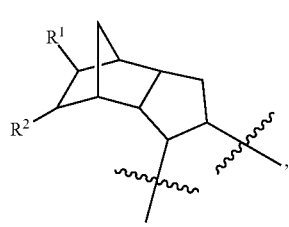

Formula (II)

in the structural unit represented by Formula (II), $R^1$ and $R^2$ independently represent hydrogen, acryloyloxy or (methacryloyloxy)ethyleneoxy, with the proviso that $R^1$ and $R^2$ are not both hydrogen,
the number average molecular weight of the cyclic olefin copolymer is 500 g/mol to 11,000 g/mol.

2. The cyclic olefin copolymer according to claim 1, wherein the cyclic olefin copolymer is formed by polymerization of a monomer reaction component comprising norbornene and a dicyclopentadiene-based compound represented by Formula (i),

Formula (i)

$R^{11}$ and $R^{21}$ represent hydrogen, acryloyloxy or (methacryloyloxy)ethyleneoxy, with the proviso that $R^{11}$ and $R^{21}$ are not both hydrogen.

3. The cyclic olefin copolymer according to claim 2, wherein a molar ratio of the norbornene to the dicyclopentadiene-based compound represented by the Formula (i) is 1:9 to 9:1.

4. The cyclic olefin copolymer according to claim 1, further comprising a α-olefin-based structural unit.

5. The cyclic olefin copolymer according to claim 4, wherein the α-olefin-based structural unit is a structural unit represented by Formula (III),

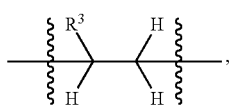

Formula (III)

$R^3$ is $C_{1-10}$ alkyl group, $C_{1-10}$ fluoroalkyl group, $C_{3-10}$ alkenyl group, $C_{6-12}$ aryl group, $C_{6-12}$ arylalkyl group, $C_{5-12}$ cycloalkyl group, $C_{6-12}$ cycloalkylalkyl group, $C_{2-6}$ alkanoyl group, $C_{2-6}$ alkanoyloxy group or $C_{2-6}$ alkoxycarbonyl group.

6. The cyclic olefin copolymer according to claim 4, wherein the cyclic olefin copolymer is formed by polymerization of a monomer reaction component comprising norbornene, a dicyclopentadiene-based compound represented by Formula (i), and the α-olefin-based compound,

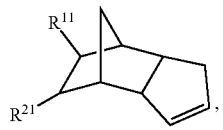

Formula (i)

R$^{11}$ and R$^{21}$ represent hydrogen, acryloyloxy or (methacryloyloxy)ethyleneoxy, with the proviso that R$^{11}$ and R$^{21}$ are not both hydrogen.

7. The cyclic olefin copolymer according to claim 6, wherein taking the sum of the number of moles of the norbornene and the dicyclopentadiene-based compound represented by Formula (i) as 1 mol as a calculation basis, the usage amount of the α-olefin-based compound is 0.01 eq to 0.5 eq.

8. The cyclic olefin copolymer according to claim 2, wherein the polymerization reaction is carried out under the condition that at least one metal catalyst is present, and a molar ratio of the usage amount of the metal catalyst to the monomer reaction component is 1:5000 to 1:25000.

9. The cyclic olefin copolymer according to claim 8, wherein the metal catalyst is ruthenium carbene complex.

10. The cyclic olefin copolymer according to claim 1, wherein the number average molecular weight of the cyclic olefin copolymer is 1300 g/mol to 7500 g/mol.

11. A curable composition, comprising: the cyclic olefin copolymer according to claim 1 and at least one resin, and a weight ratio of the cyclic olefin copolymer to the resin is 10:90 to 90:10.

12. The curable composition according to claim 11, wherein the number average molecular weight of the resin is 600 g/mol to 5000 g/mol.

13. The curable composition according to claim 11, wherein the resin is selected from phenol resin, novolac resin, polystyrene resin, polyolefin resin, epoxy resin, polyimide resin, maleimide resin, bismaleimide resin, cyanate ester resin, styrene-butadiene copolymer resin, polyamide resin or polyphenylene ether resin.

14. The curable composition according to claim 11, wherein the curable composition has a solid content of 10 wt % to 100 wt %.

15. A composite product, comprising: a substrate and a cured product distributed in the substrate and formed from the curable composition according to claim 11.

16. The composite product according to claim 15, wherein the substrate is glass fiber cloth.

17. A laminate, comprising: a conductive component and an insulating layer disposed on a surface of the conductive component, and wherein the insulating layer comprises a cured product formed from the curable composition according to claim 11.

18. The laminate according to claim 17, wherein the laminate is a copper foil substrate, a printed circuit board, or an integrated circuit carrier board.

19. A laminate, comprising: a conductive component and an insulating layer disposed on a surface of the conductive component, and wherein the insulating layer comprises the composite product according to claim 15.

20. The laminate according to claim 19, wherein the laminate is a copper foil substrate, a printed circuit board, or an integrated circuit carrier board.

* * * * *